United States Patent
Orlowski et al.

(10) Patent No.: US 7,291,521 B2
(45) Date of Patent: Nov. 6, 2007

(54) SELF CORRECTING SUPPRESSION OF THRESHOLD VOLTAGE VARIATION IN FULLY DEPLETED TRANSISTORS

(75) Inventors: Marius K. Orlowski, Austin, TX (US); Yasuhito Shiho, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 354 days.

(21) Appl. No.: 11/113,589

(22) Filed: Apr. 25, 2005

(65) Prior Publication Data
US 2006/0240629 A1   Oct. 26, 2006

(51) Int. Cl.
*H01L 21/84* (2006.01)

(52) U.S. Cl. ............... 438/155; 438/517; 257/E21.704

(58) Field of Classification Search ............... 438/155, 438/517, 919; 257/E21.704
See application file for complete search history.

(56) References Cited

U.S. PATENT DOCUMENTS

| | | | | |
|---|---|---|---|---|
| 5,488,001 | A | * | 1/1996 | Brotherton ................ 438/517 |
| 6,222,234 | B1 | * | 4/2001 | Imai ........................... 257/347 |
| 6,261,878 | B1 | * | 7/2001 | Doyle et al. ................ 438/151 |

OTHER PUBLICATIONS

Brady, F.T. and Haddad, N.F.; Manufacturability Considerations for Fully Depleted SOI; SOI Conference, 1993 Proceedings, pp. 130-131, 1993 IEEE International.
Noguchi, M., et al.; Back Gate Effects on Threshold Voltage Sensitivity to SOI Thickness in Fully-Depleted SOI MOSFETs; IEEE Electron Device Letters, vol. 22, No. 1, Jan. 2001.

* cited by examiner

*Primary Examiner*—Chandra Chaudhari

(57) ABSTRACT

A semiconductor fabrication method includes implanting or otherwise introducing a counter doping impurity distribution into a semiconductor top layer of a silicon-on-insulator (SOI) wafer. The top layer has a variable thickness including a first thickness at a first region and a second thickness, greater than the first, at a second region. The impurity distribution is introduced into the top layer such that the net charge deposited in the semiconductor top layer varies linearly with the thickness variation. The counter doping causes the total net charge in the first region to be approximately equal to the net charge in the second region. This variation in deposited net charge leads to a uniform threshold voltage for fully depleted transistors. Fully depleted transistors are then formed in the top layer.

15 Claims, 1 Drawing Sheet

US 7,291,521 B2

SELF CORRECTING SUPPRESSION OF THRESHOLD VOLTAGE VARIATION IN FULLY DEPLETED TRANSISTORS

FIELD OF THE INVENTION

The invention disclosed herein is in the field of integrated circuits and more particularly integrated circuits having fully depleted SOI transistors.

RELATED ART

Semiconductor-on-insulator (SOI) technology is prevalent in the semiconductor industry. An SOI process uses a starting material that includes a thin (less than approximately 40 nm) semiconductor top layer overlying a buried oxide (BOX) layer. The BOX layer overlies a semiconductor bulk portion of the wafer. The transistors and other devices are formed in the top layer. If the thickness of the semiconductor layer allows transistor operation in the so-called fully-depleted mode, transistors formed in this thin top layer exhibit lower threshold voltages, less junction leakage, and lower junction capacitance than transistors formed in conventional bulk wafers. A transistor is referred to as fully-depleted when its channel depletion width exceeds the thickness of the semiconductor layer. The quality of being full-depleted is a function of silicon film thickness and the average doping.

SOI technologies are sometimes classified according to whether they employ partially depleted or fully-depleted transistors. In fully-depleted processes, application of a normal operating bias will displace substantially all of the majority carriers in the transistor channel region. As such, the depletion region in a fully-depleted SOI transistor extends from the interface between the top layer and the gate dielectric to the interface between the top layer and the BOX layer.

The threshold voltage of a NMOS transistor is a function of $N_A$, the concentration of acceptor atoms in the channel region. Assuming uniform doping of the channel region, the number of acceptor atoms per area in the channel region of a fully depleted transistor is a function of the depletion region depth, which is the thickness of the top semiconductor layer for the fully-depleted transistor.

Obtaining a uniform threshold voltage across a wafer is difficult in fully depleted SOI technologies because the top layer thickness tends to vary across the wafer. In many cases, the top layer thickness of the starting material is non uniform. Additional processing tends only to exacerbate any non uniformity of the starting material. Moreover, attempting to produce a rigidly uniform top layer thickness in an SOI technology would be difficult, not only in terms of cost and complexity, but also in terms of effectiveness and manufacturability.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the present invention is concerned with addressing undesirable affects caused by variations in the thickness of the top layer of an SOI wafer. More specifically, the present invention addresses threshold voltage variations attributable to variable top layer thickness in fully depleted SOI technologies. Top layer thickness variations result in depletion charge variations and threshold voltage variations. The invention counters the depletion charge variations with a counter doping measure. The amount (net charge) of counter doping in regions of the wafer where the top layer is thicker is greater than the amount of counter doping in regions of the wafer where the top layer is thinner and preferably varies approximately linearly with the film thickness variation. In this manner, the counter doping results in an effective depletion charge that is independent of the top layer thickness.

Figure 1:
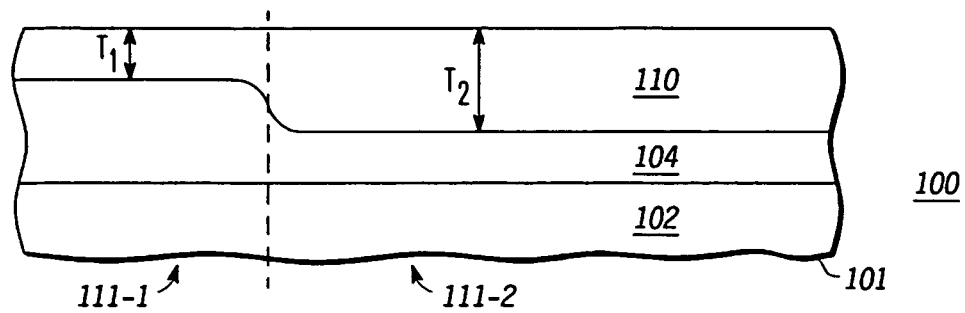
FIG. 1 is a partial cross sectional view of a wafer at a first selected stage in a semiconductor fabrication process according to one embodiment of the present invention emphasizing an SOI wafer having a variable thickness top layer.

Referring now to FIG. 1, a partial cross sectional view of an SOI wafer 101 at a first stage in a process for fabricating an integrated circuit 100 according to one embodiment of the invention is depicted. In the depicted embodiment, SOI wafer 101 includes a top layer 110 overlying a buried oxide (BOX) layer 104. BOX layer 104 overlies a bulk portion 102 of wafer 101. BOX layer 104 is preferably a silicon oxide compound such as a thermally formed or CVD silicon oxide compound. In an exemplary implementation, BOX layer 104 has a nominal thickness of approximately 20 to 100 nm. Bulk portion 102 of wafer 101 is preferably a lightly doped, single crystal silicon bulk portion.

Top layer 110 is a crystalline semiconductor material such as silicon, strained silicon, SiGe SiC, or a combination thereof. A thickness of top layer 110 is preferably less than approximately 40 nm. Ideally, the thickness of top layer 110 would be constant across wafer 101. In practice, however, as depicted schematically in FIG. 1, the thickness of top layer 110 varies across the wafer. Top layer 110 as depicted in FIG. 1 includes a first region 111-1 having a first thickness $T_1$ and a second region 111-2 having a second thickness $T_2$. In the depicted example, $T_1$ is less than $T_2$. In one implementation, first thickness $T_1$ represents a minimum thickness ($T_{MIN}$) of top layer 110 and second thickness $T_2$ represents a maximum thickness ($T_{MAX}$) of top layer 110. Top layer 110 might, for example, have a nominal thickness of 25 nm+/− 2.5 nm (10%) such that the minimum thickness $T_1$ is approximately 22.5 nm and the maximum thickness $T_2$ is 27.5 nm.

FIG. 1 depicts wafer 101 as having two distinct thickness values ($T_1$ and $T_2$) for top layer 110 and an abrupt transition between a region 111-1 where top layer 110 has the first thickness $T_1$ and a region 111-2 where top layer 110 has the second thickness $T_2$. Moreover, FIG. 1 depicts top layer 110 as having "locally uniform thickness" meaning that, within a confined region, the thickness of upper surface 110 is uniform. Depicting upper surface 110 in this manner is suitable for emphasizing an inventive concept in which a transistor "self corrects" its threshold voltage to account for variations in channel region thickness. In reality, however, top layer 110 is more likely to exhibit a continuum of thickness values with gradual and continuous transitions. The self-correcting threshold voltage aspect of the invention is equally applicable to a wafer having top layer exhibiting this more likely type of thickness variation.

Figure 2:
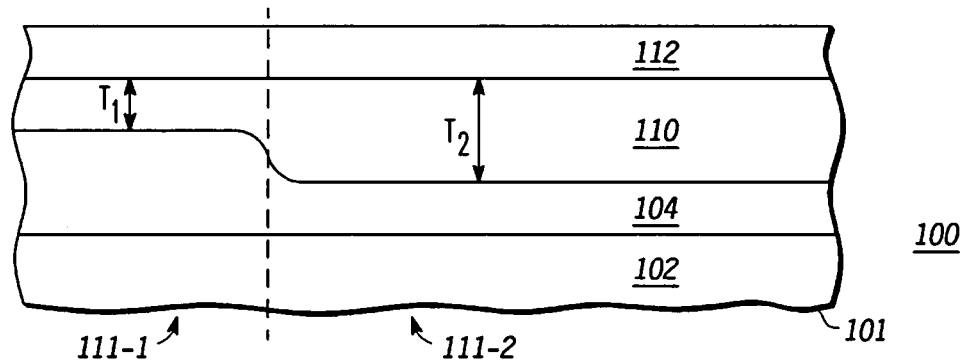
FIG. 2 depicts processing subsequent to FIG. 1 in which a dielectric layer is formed overlying the top layer.

Referring now to FIG. 2, an optional sacrificial layer 112 is formed overlying wafer 101. When sacrificial layer 112 is used, its thickness and composition are implementation specific. An important concept of the present invention is introducing a counter doping species into the wafer 101 such that the percentage or portion of the implanted dose that affects the electrical characteristics of a subsequently formed transistor varies with the thickness of semiconductor top layer 110. Achieving this result requires the ability to locate the counter doping species at a desired depth below the wafer upper surface. In addition, it is desirable to control the concentration gradient (referred to herein as the slope) of the counter doping species. Independent control of the concentration gradient and the depth is not always possible. Accordingly, sacrificial layer 112, in addition to reducing ion impact damage in the upper regions of top layer 110 when the counter doping implant occurs, also enables the process greater latitude in specifying the depth and slope of the implanted impurity distribution.

In the depicted embodiment, the formation of sacrificial layer 112 consumes an upper portion of semiconductor top layer 110. Thermal oxidation of a silicon layer, for example, is well known to consume a portion of the silicon. Accordingly, the thickness $T_1$ in region 111-1 of semiconductor top layer 110 is less than the thickness $T_1$ in region 111-1 prior to the formation of sacrificial layer 112. Similarly, the thickness $T_2$ in region 111-2 of semiconductor top layer 110 is less than the thickness $T_2$ in region 111-2 prior to the formation of the sacrificial layer 112. Nevertheless, the relative thickness of top layer 110 in regions 111-1 and 111-2 remains the same (i.e., $T_1$ is less than $T_2$ before and after formation of sacrificial layer 112).

Figure 3:
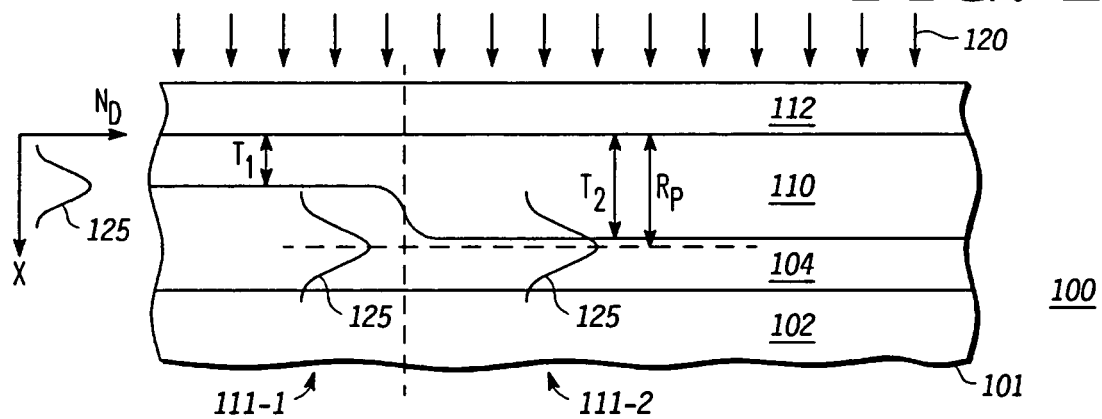
FIG. 3 depicts processing subsequent to FIG. 2 in which counter doping is introduced the wafer such that the impurity distribution introduced into the top layer varies with the thickness of the top layer.

Referring now to FIG. 3, a counter doping impurity distribution, represented by reference numeral 125, is introduced into wafer 101. Counter doping impurity distribution is represented in FIG. 3 as a curved line indicative of the impurity concentration as a function of depth below an upper surface of wafer 101. Counter doping impurity distribution 125 has a first conductivity type (n-type or p-type) that is opposite the conductivity type of semiconductor top layer 110. For NMOS transistors (in which the transistor channel region is p-type), counter doping impurity distribution 125 is an n-type impurity such as arsenic, phosphorous or antimony. For PMOS transistors, counter doping impurity distribution 125 would be a p-type impurity such as boron or indium. In the depicted embodiment, counter doping impurity distribution 125 is introduced into wafer 101 through the sacrificial layer 112 using a conventional ion implantation process represented by reference numeral 120.

Counter doping impurity distribution 125 may be controlled by appropriate choice of implant species, implant energy, implant dose, and the thickness of sacrificial layer 112. In one embodiment, the implant energy is preferably approximately 200 eV, which enables placement of the peak concentration depth (Rp) within approximately 5 Angstroms (0.5 nm). In some embodiments, the counter doping implant may be achieved using multiple implants. In these embodiments, the various implants may use different species (e.g., P and/or As for n-type implants and B and/or $BF_2$ for p-type implants), different implant energies, or different implant doses. Regardless of the implant method selected, the objective is to create an active counter doping dose in semiconductor top film 110 that varies linearly with the variation of the film's thickness (T).

As depicted in FIG. 3, counter doping impurity distribution 125 is implanted into wafer 101 such that a peak concentration of the counter doping impurity distribution 125 is positioned at a depth ($R_P$) below an upper surface of top layer 110 that is somewhat greater than the maximum thickness $T_2$ of top layer 110. For an implementation in which the nominal thickness of wafer upper surface 110 is roughly 25 nm and the variation in wafer uppers surface 110 is roughly 2.5 nm, the peak concentration of counter doping impurity distribution 125 is positioned at a depth of approximately 30 nm (below the upper surface of top layer 110. More generally, for an effective oxide thickness of approximately 2.0 nm and doping of the top layer 110, the peak concentration depth $R_P$ of counter doping impurity distribution 125 exceeds the top layer maximum depth $T_{MAX}$ by approximately 8 to 20 percent (i.e., $1.08 \leq R_P/T_{MAX} \leq 1.20$).

By appropriately positioning the peak impurity concentration of counter doping impurity distribution 125 below the maximum thickness top layer 110, a roughly linear region of the impurity distribution concentration gradient extends into semiconductor top layer 110. Where top layer 110 is thinnest (e.g., in region 111-1), counter doping impurity distribution 125 is primarily located within BOX layer 104 where the impurities are not free to affect device characteristics. Where top layer 110 is thickest (e.g., region 111-2), more of counter doping impurity distribution 125 lies within top layer 110. Thus, a first percentage of counter doping impurity distribution 125 is located in semiconductor top layer 110 in first region 111-1 and a second percentage of counter doping impurity distribution 125 is located in top layer 110 in second region 111-2 where the first and second percentages are a function and, preferably, an approximately linear function, of the semiconductor top layer thickness ($T_{Si}$). The percentage of counter doping impurity distribution 125 located in top layer 110 is lower in thinner regions of top layer 110 than it is in thicker regions.

Appropriate positioning of counter doping impurity distribution 125 results in less counter doping within the thin portions of top layer 110 and more counter doping to be within the thicker portions of top layer 110. Less counter doping is needed in thin regions of top layer 110 (e.g., region 111-1) because of the lesser number of acceptor atoms in the this region and, conversely, more counter doping is needed in thick regions of top layer 110 (e.g., region 111-2). Ideally, the amount of counter doping present at any point in top layer 110 is just sufficient to offset the acceptor atom variation at that point in top layer 110.

Quantitatively, assuming that the starting substrate is uniformly doped with $N_A$, the $V_T$ shift due to doping $N_A$ is $\Delta V_T = q N_A T_{Si} T_{ox}/\epsilon_{ox}$. Assume that the cross wafer thickness variation ($\delta T_{Si}$) of top layer 110 is $\pm 0.1(T_{Si})$, then the variation of the $\Delta V_T$ shift $\delta(\Delta V_T) = 0.2 \, \delta T_{Si} N_A q/C_{ox}$, and the dose needed to be balanced $D = 0.2 T_{Si} N_A$. Applying these equations to a practical configuration, suppose an implementation in which $N_A = 5 \times 10^{17}$ cm$^{-3}$, $T_{ox} = 25$A, $T_{Si} = 250$A. The $\Delta V_T = 177$ mV and $\delta (\Delta V_T) = 35$ mV. To balance the $V_T$ variations between the "thinnest" transistor (where $T_{Si} = 225$A) and the "thickest" transistor (where $T_{Si} = 275$A) a counter-dose differential is needed to offset the difference in acceptor atoms. The counter dose differential $D_{count} = 0.2 T_{Si} N_A = 2.5 \times 10^{11}$ cm$^{-2}$. In this example, implant 120 is controlled so that the difference in dose between the thin region 111-1 of top layer 110 and the thick layer is approximately $2.5 \times 10^{11}$ cm$^{-2}$. Continuing with this example, a suitable implant 120 uses an arsenic implant dose of approximately $1.2 \times 10^{12}$ cm$^{-2}$ and an implant energy of approximately 42 keV. Under these conditions, the implant 120 would have a projected range $R_P$ of approximately 30 nm and a projected straggle $\Delta R_P$ of approximately 7.5 nm where $R_P$ equates to the depth of the peak concentration of counter doping impurity distribution 125. More generally, the implant would preferably have an $R_P$ that exceeds $T_{MAX}$ by approximately 8 to 20% and would have a straggle $\Delta R_P$ that is 20 to 30% of the projected range.

By controlling counter doping impurity distribution 125 appropriately, the net amount of active dopant provided by the counter doping implant varies approximately linearly with $T_{Si}$ over a reasonable range of $T_{Si}$ (e.g., from $T_{MIN}$ to $T_{MAX}$). As a result, counter doping impurity distribution 125 compensates automatically for all $T_{Si}$ variations within the reasonable range. This compensation produces uniform Vt over the entire wafer irrespective of local $T_{Si}$.

Figure 4:
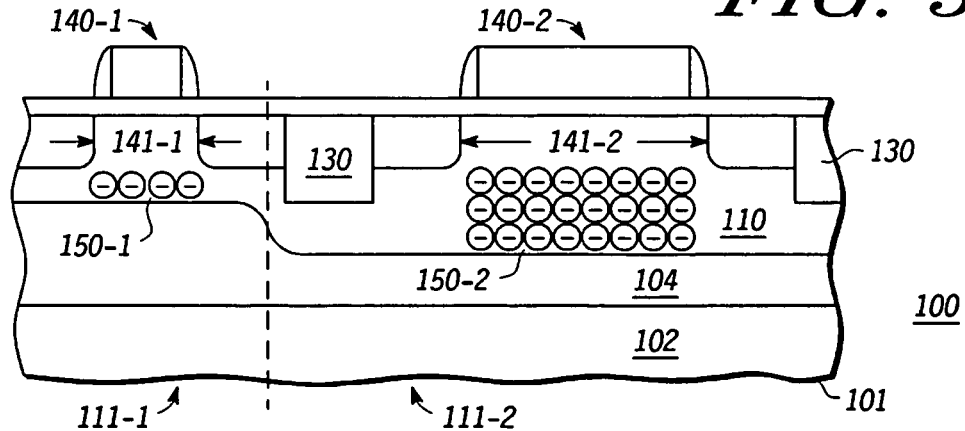
FIG. 4 depicts processing subsequent to FIG. 3 in which transistors are fabricated to form an integrated circuit.

Turning now to FIG. 4, an integrated circuit 100 including first transistor 140-1 and a second transistor 140-2 are formed overlying wafer 101. Isolation trenches 130 separate first transistor 140-1 from second transistor 140-2. In the depicted embodiment, first transistor 140-1 represents a transistor that overlies a relatively thin portion of top layer 110 while second transistor 140-2 overlies a relatively thick portion of top layer 110.

FIG. 4 also indicates the relative amount of counter doping caused by the counter doping impurity distribution 125 of FIG. 3. Counter doping is represented by fixed negative charges (donor atoms) in FIG. 4. This example is applicable for NMOS regions of wafer 101. (The polarities are reversed for PMOS regions). In the first (thin) region 111-1 of top layer 110, the counter doping 150-1 attributable to counter doping impurity distribution 125 is relatively light whereas, in second (thick) region 111-2 of top layer 110, the counter doping 150-2 is relatively heavy. Thus, the quantity of counter doping donor atoms in channel region 141-2 underlying second transistor 140-2 exceeds the quantity of counter doping donor atoms 150-1 in top layer region 111-1. The difference between the counter doping donor atoms 150 in the thin and thick regions of top layer 110 partially or fully offsets the difference in acceptor atoms in channel regions 141-1 and 141-2. The difference in acceptor atoms is inherent in the different thicknesses of top layer 110 (assuming uniform acceptor atom doping). The presence of counter doping impurity distribution 125 thus reduces the difference in net charge between the transistor channels 141 of top layer regions 111-1 and 111-2.

Transistors 140-1 and 140-2 are fully depleted transistors. In fully depleted transistors, application of a threshold voltage to the gate electrode creates a depletion region in channel regions 141 that extends from an upper surface of top layer 110 to BOX layer 104. The depletion charge in channel region 141 of a fully depleted device is a function of not only the acceptor atom impurity concentration $N_A$, but also the thickness of top layer 110. In the absence of counter doping impurity distribution 125, transistors formed overlying thicker regions of top layer 110 will have more depletion charge than transistors formed overlying thinner regions of top layer 110. Because counter doping impurity distribution 125 provides an offset to the depletion charge that also varies with the top layer thickness, the net effect of counter doping impurity distribution 125 is to reduce or eliminate differences in net depletion charge of the transistors.

In the foregoing specification, the invention has been described with reference to specific embodiments. However, one of ordinary skill in the art appreciates that various modifications and changes can be made without departing from the scope of the present invention as set forth in the claims below. For example, although the disclosure emphasizes single gate NMOS transistors, the invention is applicable to PMOS transistors and potentially to other types of transistors such as floating gate transistors. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication method, comprising:
introducing a counter doping impurity distribution having a first conductivity type into a semiconductor layer of a semiconductor-on-insulator (SOI) wafer having a second conductivity type, the SOI wafer including the semiconductor layer overlying a buried oxide (BOX) layer;
wherein the top semiconductor layer has a first thickness at a first region in the wafer and a second thickness at a second region in the wafer wherein the first thickness is less than the second thickness;
wherein the counter doping impurity distribution is introduced wherein a first percentage of the impurity distribution is located in the semiconductor layer at the first region and wherein a second percentage of the impurity does is located in the semiconductor layer at the second region, wherein the first percentage is less than the first;
wherein the counter doping impurity distribution reduces a difference in net charge between the first region and the second region.

2. The method of claim 1, further comprising forming a first fully depleted transistor overlying the first region and a second fully depleted transistor overlying the second region, wherein a depletion region in a channel of the first and second transistors extends from an upper surface of the semiconductor layer to the BOX layer.

3. The method of claim 1, wherein introducing the counter doping impurity distribution comprises ion implanting the counter doping impurity distribution into the semiconductor layer.

4. The method of claim 3, wherein the second thickness of the semiconductor layer is a maximum thickness ($T_{MAX}$) of the semiconductor layer and further wherein implanting the counter doping impurity distribution comprises implanting the counter doping impurity distribution wherein a depth of a peak concentration of the implanted impurity distribution is greater than the maximum thickness.

5. The method of claim 4, wherein implanting the impurity distribution includes implanting the impurity distribution with a projected range ($R_P$) wherein $R_P/T_{MAX}$ is in the range of approximately 1.08 to 1.20.

6. The method of claim 5, wherein implanting the impurity distribution includes implanting the impurity distribution with a projected straggle ($\Delta R_P$), wherein $\Delta R_P/R_P$ is in the range of approximately 0.2 to 0.3.

7. The method of claim 1, further comprising, prior to introducing the impurity distribution into the semiconductor layer, forming a sacrificial layer overlying the semiconductor layer.

8. A semiconductor fabrication method for use with a semiconductor-on-insulator (SOI) wafer having a semiconductor layer overlying a buried oxide (BOX) layer, comprising:
 implanting a counter doping impurity distribution into the SOI wafer, wherein a peak concentration of the counter doping impurity distribution is located at a depth that is greater than a maximum thickness of the semiconductor layer; and
 wherein a first percentage of the impurity distribution contributes to the net depletion charge in a first region of the semiconductor layer and wherein a second percentage of the impurity distribution contributes to the net depletion charge in a second region of the semiconductor layer wherein the first percentage and the second percentage differ.

9. The method of claim 8, wherein the first thickness and the second thickness differ and wherein net depletion charge in the first and second regions is approximately equal when the semiconductor layer is biased to full depletion.

10. The method of claim 8, wherein implanting the counter doping impurity distribution includes selectively implanting the a first counter doping impurity distribution into NMOS regions of the semiconductor layer and selectively implanting a second counter doping impurity distribution into PMOS regions of the semiconductor layer.

11. The method of claim 10, wherein the first counter doping impurity distribution comprises an arsenic impurity distribution and wherein the second counter doping impurity distribution comprises a boron impurity distribution.

12. The method of claim 11, wherein the semiconductor layer comprises silicon and has a maximum thickness of approximately 27.5 nm and an acceptor atom doping concentration ($N_A$) of approximately $5 \times 10^{17}$ cm$^{-3}$ in the NMOS regions, and wherein implanting the first counter doping impurity distribution comprises implanting arsenic using a dose of approximately $1.2 \times 10^{12}$ cm$^{-2}$ and an energy of approximately 42 keV.

13. The method of claim 8, wherein a thickness of the semiconductor layer varies from the first region to the second region.

14. The method of claim 13, wherein the first and second percentages vary approximately linearly with the thickness of the semiconductor layer in the first and second regions respectively.

15. The method of claim 8, wherein the depth of the peak concentration of the counter doping impurity distribution is greater than the maximum thickness by approximately 8 to 20%.

* * * * *

UNITED STATES PATENT AND TRADEMARK OFFICE
CERTIFICATE OF CORRECTION

| | | |
|---|---|---|
| PATENT NO. | : 7,291,521 B2 | Page 1 of 1 |
| APPLICATION NO. | : 11/113589 | |
| DATED | : November 6, 2007 | |
| INVENTOR(S) | : Marius K. Orlowski | |

It is certified that error appears in the above-identified patent and that said Letters Patent is hereby corrected as shown below:

In Column 6, Line 47, Claim No. 1:
　　Change "impurity does is located in the semiconductor layer at" to --impurity dose is located in the semiconductor layer at--

In Column 8, Line 3, Claim No. 10:
　　Change "implanting the a first counter doping impurity distribution" to --implanting a first counter doping impurity distribution--

Signed and Sealed this

Nineteenth Day of August, 2008

JON W. DUDAS
*Director of the United States Patent and Trademark Office*